United States Patent
Jun et al.

(10) Patent No.: US 9,668,342 B2
(45) Date of Patent: May 30, 2017

(54) COMPOSITION AND METHOD FOR FORMING CONDUCTIVE PATTERN, AND RESIN STRUCTURE HAVING CONDUCTIVE PATTERN THEREON

(71) Applicant: LG CHEM, LTD., Seoul (KR)

(72) Inventors: Shin Hee Jun, Daejeon (KR); Chee-Sung Park, Daejeon (KR); Jae Hyun Kim, Daejeon (KR); Sang Yun Jung, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 44 days.

(21) Appl. No.: 14/895,143

(22) PCT Filed: Sep. 22, 2014

(86) PCT No.: PCT/KR2014/008789
§ 371 (c)(1),
(2) Date: Dec. 1, 2015

(87) PCT Pub. No.: WO2015/046840
PCT Pub. Date: Apr. 2, 2015

(65) Prior Publication Data
US 2016/0128188 A1    May 5, 2016

(30) Foreign Application Priority Data

Sep. 27, 2013 (KR) .................. 10-2013-0115256
Sep. 22, 2014 (KR) .................. 10-2014-0125814

(51) Int. Cl.
*H05K 1/09*    (2006.01)
*H05K 3/10*    (2006.01)
(Continued)

(52) U.S. Cl.
CPC .......... *H05K 1/092* (2013.01); *C23C 18/161* (2013.01); *C23C 18/1608* (2013.01);
(Continued)

(58) Field of Classification Search
CPC .......... H05K 1/09; H05K 1/092; H05K 1/095; H05K 1/097; H05K 3/105
See application file for complete search history.

(56) References Cited

U.S. PATENT DOCUMENTS

| 5,599,592 A | 2/1997 | Laude |
| 8,236,670 B2 | 8/2012 | Wessels et al. |

(Continued)

FOREIGN PATENT DOCUMENTS

| CN | 101410754 A | 4/2009 |
| CN | 101747650 A | 6/2010 |

(Continued)

OTHER PUBLICATIONS

XP-002760299, STN Search, Gong et al., Plastic composition and its application, and selective metalization method of plastic surface, CA PLUS—2010:801427, Entered STN: Jun. 29, 2010.

*Primary Examiner* — Jeremy C Norris
(74) *Attorney, Agent, or Firm* — Dentons US LLP

(57) ABSTRACT

The present invention relates to a composition for forming a conductive pattern which is capable of forming a fine conductive pattern reducing deterioration of mechanical-physical properties and having excellent adhesion strength onto a variety of polymeric resin products or resin layers, a method for forming the conductive pattern using the same, and a resin structure having the conductive pattern. The composition for forming a conductive pattern includes a polymer resin; and non-conductive metal compound particles including a first metal element and a second metal element, having a $R\bar{3}m$ or $P6_3/mmc$ space group in crystal (Continued)

structure, and having a particle size of 0.1 to 20 μm, wherein a metal nuclei including the first metal or the second metal element or an ion thereof is formed from the non-conductive metal compound particles by electromagnetic irradiation.

16 Claims, 8 Drawing Sheets

(51) Int. Cl.
*H01B 1/22* (2006.01)
*H05K 3/00* (2006.01)
*H05K 3/18* (2006.01)
*C23C 18/16* (2006.01)
*C23C 18/20* (2006.01)
*H05K 1/03* (2006.01)
*C23C 18/40* (2006.01)

(52) U.S. Cl.
CPC ...... *C23C 18/1612* (2013.01); *C23C 18/1641* (2013.01); *C23C 18/1658* (2013.01); *C23C 18/204* (2013.01); *H01B 1/22* (2013.01); *H05K 3/0014* (2013.01); *H05K 3/105* (2013.01); *H05K 3/181* (2013.01); *H05K 3/185* (2013.01); *C23C 18/405* (2013.01); *H05K 1/0373* (2013.01); *H05K 2201/0236* (2013.01); *H05K 2201/09118* (2013.01); *H05K 2203/107* (2013.01)

(56) References Cited

U.S. PATENT DOCUMENTS

| | | | |
|---|---|---|---|
| 2009/0292051 | A1 | 11/2009 | Li et al. |
| 2012/0279764 | A1 | 11/2012 | Jiang et al. |
| 2013/0048519 | A1 | 2/2013 | Liao |

FOREIGN PATENT DOCUMENTS

| | | | |
|---|---|---|---|
| CN | 102071423 A | 5/2011 | |
| CN | 102391633 A | 3/2012 | |
| CN | 102950836 A | 3/2013 | |
| EP | 2584065 A2 | 4/2013 | |
| JP | 2000-31463 A | 1/2000 | |
| JP | 2000-502407 A | 2/2000 | |
| JP | 2001-291721 A | 10/2001 | |
| JP | 2002-158229 A | 5/2002 | |
| JP | 2002-158418 A | 5/2002 | |
| JP | 2006-309202 A | 11/2006 | |
| KR | 10-2004-0021614 A | 3/2004 | |
| KR | 10-0614139 B1 | 8/2006 | |
| KR | 10-0651519 B1 | 11/2006 | |
| KR | 10-2011-0018319 | 2/2011 | |
| KR | 10-2011-0112860 A | 10/2011 | |
| KR | 10-2014-0128233 A | 11/2014 | |
| TW | 201233272 A1 | 8/2012 | |
| WO | 2007/000833 A1 | 1/2007 | |
| WO | 2007/112878 A1 | 10/2007 | |
| WO | 2011072506 A1 | 6/2011 | |
| WO | 2014161493 A1 | 10/2014 | |

COMPOSITION AND METHOD FOR FORMING CONDUCTIVE PATTERN, AND RESIN STRUCTURE HAVING CONDUCTIVE PATTERN THEREON

This application is a National Stage Entry of International Application No. PCT/KR2014/008789, filed Sep. 22, 2014, and claims the benefit of and priority to Korean Application Nos. 10-2013-0115256, filed Sep. 27, 2013 and 10-2014-0125814, filed Sep. 22, 2014, all of which are hereby incorporated by reference in their entirety for all purposes as if fully set forth herein.

TECHNICAL FIELD

The present invention relates to a composition for forming a conductive pattern which is capable of forming a fine conductive pattern reducing deterioration of mechanical-physical properties and having excellent adhesion strength on a variety of polymeric resin products or resin layers, a method for forming the conductive pattern using the same, and a resin structure having the conductive pattern.

BACKGROUND

With the recent development of microelectronic technology, a need for structures having a fine conductive pattern formed on the surface of a polymeric resin substrate (or product) such as a variety of resin products or resin layers has grown. The conductive patterns on the surface of the polymeric resin substrate and the structure may be applied to form various objects such as antennas integrated into a mobile phone case, a variety of sensors, MEMS structures, RFID tags, and the like.

As such, with increasing interest in the technology of forming the conductive pattern on the surface of the polymeric resin substrate, several technologies regarding this were suggested. However, a more effective method for these technologies has not been suggested yet.

For example, according to the previous technology, a method for forming the conductive pattern by forming a metal layer on the surface of the polymeric resin substrate and then applying photolithography, or a method for forming the conductive pattern by printing a conductive paste may be considered. However, when the conductive pattern is formed according to this technology, there are limitations that a process or equipment to be needed becomes too complicated, or it is difficult to form an excellent fine conductive pattern Accordingly, there is a need to develop a technology capable of more effectively forming the fine conductive pattern on the surface of the polymer is resin substrate by a simple process.

In order to fulfill the demand in the art, a technology of forming the conductive pattern by using a composition to which specific non-conductive metal compounds, and the like, are blended to the polymer resin, and performing direct irradiation of electromagnetic waves such as laser, and the like, has been suggested. According to this technology, the electromagnetic waves such as laser, and the like, are directly irradiated onto a predetermined region of the composition to selectively expose metal components of the non-conductive metal compound, followed by electroless plating on the corresponding region, thereby forming the conductive pattern.

However, when this technology is applied, since brittleness is increased due to addition of the non-conductive metal compound, there are many cases in which mechanical-physical properties such as impact strength, and the like, of the polymeric resin substrate (or product) itself are deteriorated.

In addition, when the conductive pattern is formed by the above technology, the conductive pattern has poor adhesion strength with the polymeric resin substrate, such that a problem that it is difficult to form excellent conductive pattern, and the like, also occur.

Due to the above problems, the above-described technology has not been widely applied, and development of relevant technology has been continuously demanded.

SUMMARY OF THE INVENTION

The present invention has been made in an effort to provide a composition for forming a conductive pattern which is capable of forming a fine conductive pattern reducing deterioration of mechanical-physical properties and having excellent adhesion strength onto a variety of polymeric resin products or resin layers, and a method for forming the conductive pattern using the same.

In addition, the present invention has been made in an effort to provide a resin structure having the conductive pattern which is formed from the composition for forming the conductive pattern, or the like.

An exemplary embodiment of the present invention provides a composition for forming a conductive pattern by electromagnetic irradiation, including: a polymer resin; and non-conductive metal compound particles including a first metal element and a second metal element, having a R$\bar{3}$m or P$6_3$/mmc space group in crystal structure, and having a particle size of 0.1 to 20 μm, wherein a metal nuclei including the first metal or the second metal element or an ion thereof is formed from the non-conductive metal compound particles by electromagnetic irradiation.

Specific examples of the non-conductive metal compound particles may include one or more compounds selected from the group consisting of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$ and $CuSnO_2$, such that the metal nuclei may be formed well by electromagnetic irradiation to form a more excellent conductive pattern.

In addition, the composition for forming a conductive pattern may exhibit reflectivity of 25% or less, or approximately 10 to 25%, with respect to a laser electromagnetic wave having a wavelength of approximately 1000 nm to 1200 nm.

Further, in the composition for forming a conductive pattern, the metal nuclei may be formed by irradiating a laser electromagnetic wave having a wavelength of approximately 1000 nm to 1200 nm at an average power of approximately 5 to 20 W. By controlling the irradiation conditions of laser electromagnetic wave, the metal nuclei may be more effectively formed on the polymer resin of the composition, and therefore, a more excellent conductive pattern may be formed.

In addition, in the composition for forming a conductive pattern, the polymer resin may include a thermosetting resin or a thermoplastic resin, and specific examples thereof may include one or more selected from the group consisting of an ABS resin, a polyalkylene terephthalate resin such as a polybutyleneterephthalate resin, a polyethyleneterephthalate resin, or the like, a polycarbonate resin, a polypropylene resin, and a polyphthalamide resin.

Further, in the composition for forming the conductive pattern, the non-conductive metal compound particles may be included in an amount of approximately 0.5 to 7 wt %, with respect to the total composition, and the polymer resin may be included in the remaining amount.

In addition, the composition for forming the conductive pattern may further include one or more additives selected from the group consisting of a heat stabilizer, a UV stabilizer, a flame retardant, a lubricant, an antioxidant, an inorganic filler, a colorant, an impact modifier, and a functional modifier, in addition to the above-described polymer resin and the predetermined non-conductive metal compound particles.

Meanwhile, another exemplary embodiment of the present invention provides a method for forming a conductive pattern by direct electromagnetic irradiation on a polymeric resin substrate such as a resin product, a resin layer, or the like, using the above-described composition for forming the conductive pattern. The method for forming a conductive pattern may include molding the composition for forming a conductive pattern as described above to a resin product or applying the composition to another product so as to form a resin layer; irradiating an electromagnetic wave to a predetermined region of the resin product or the resin layer so as to generate a metal nuclei including a first, a second metal element or an ion thereof from non-conductive metal compound particles; and chemically reducing or plating the region in which the metal nuclei is generated so as to form a conductive metal layer.

In the step of generating the metal nuclei in the method for forming the conductive pattern, a laser electromagnetic wave having a wavelength of approximately 1000 nm to 1200 nm may be irradiated at an average power of approximately 5 to 20 W, and therefore, the metal nuclei may be formed well and a more excellent conductive pattern may be formed.

Further, when the step of generating metal nuclei by electromagnetic irradiation is carried out, a part of the non-conductive metal compound particle is exposed on the surface of the predetermined region of the resin product or the resin layer, and the metal nuclei is generated therefrom, thereby forming a surface (hereinafter, "adhesion-activated surface") which is activated to have higher adhesion strength. Then, the conductive metal layer may be formed on the adhesion-activated surface by electroless plating. Upon the electroless plating, the metal nuclei have a role of seed to form a strong bonding with conductive metal ions in a plating solution, when the conductive metal ions are chemically reduced. As a result, the conductive metal layer may be selectively formed in an easier manner.

Meanwhile, another exemplary embodiment of the present invention provides a resin structure having a conductive pattern obtained by the composition for forming a conductive pattern and the method for forming a conductive pattern as described above. The resin structure may include a polymeric resin substrate; non-conductive metal compound particles including a first metal element and a second metal element, having a R$\bar{3}$m or P6$_3$/mmc space group in crystal structure, having a particle size of approximately 0.1 to 20 µm, and dispersed in the polymeric resin substrate; an adhesion-activated surface including a metal nuclei including a first, a second metal element or an ion thereof exposed on a surface of a predetermined region of the polymeric resin substrate; and a conductive metal layer formed on the adhesion-activated surface.

In the resin structure, the predetermined region on which the adhesion-activated surface and the conductive metal layer are formed may correspond to a region of the polymeric resin substrate to which an electromagnetic wave is irradiated.

Further, in the resin structure, the conductive metal layer may be deposited on the resin substrate by adhesion at which a delamination area of a target metal layer under test is 0% (Class 0), or more than 0% to 5% or less (Class 1), of an area of the metal layer, under the test according to standard ISO 2409.

In addition, an impact strength of the resin structure measured by ASTM D256 may be approximately 4.0 J/cm or more.

Advantageous Effects

According to the present invention, a composition for forming a conductive pattern which is capable of forming a fine conductive pattern on a polymeric resin substrate such as a variety of polymeric resin products or resin layers by a very simple process of laser electromagnetic irradiation, a method for forming the conductive pattern using the same, and a resin structure having the conductive pattern may be provided.

In particular, the composition for forming the conductive pattern according to the present invention uses non-conductive metal compound particles having a specific three-dimensional structure and a predetermined range of particle size, thereby more effectively forming the fine conductive pattern reducing deterioration of mechanical-physical properties such as impact strength, and the like, of the polymeric resin product or the resin layer itself and having excellent adhesion strength.

Therefore, the composition for forming the conductive pattern or the method for forming the conductive pattern may be used to very effectively form a conductive pattern for antenna on a variety of resin products such as a mobile phone case, and the like, RFID tags, various sensors, MEMS structures, and the like.

DETAILED DESCRIPTION OF THE EMBODIMENTS

Hereinafter, a composition for forming a conductive pattern, a method for forming the conductive pattern using the same, and a resin structure having the conductive pattern according to specific exemplary embodiments of the present invention will be described.

According to one exemplary embodiment of the present invention, there is provided a composition for forming a conductive pattern by electromagnetic irradiation, including: a polymer resin; and non-conductive metal compound particles including a first metal element and a second metal element, having a $R\bar{3}m$ or $P6_3/mmc$ space group in crystal structure, and having a particle size of 0.1 to 20 μm, wherein a metal nuclei including the first metal, the second metal element or an ion thereof is formed from the non-conductive metal compound particles by electromagnetic irradiation.

The composition for forming a conductive pattern includes non-conductive metal compound particles having a specific three-dimensional structure defined by a $R\bar{3}m$ or $P6_3/mmc$ space group in crystal structure, and having a specific particle size of approximately 0.1 to 20 μm, or approximately 0.3 to 10 μm, or approximately 0.5 to 3 μm. An exemplary three-dimensional structure of non-conductive metal compound which is a major component of the particle is illustrated in FIG. 1.

Figure 1:
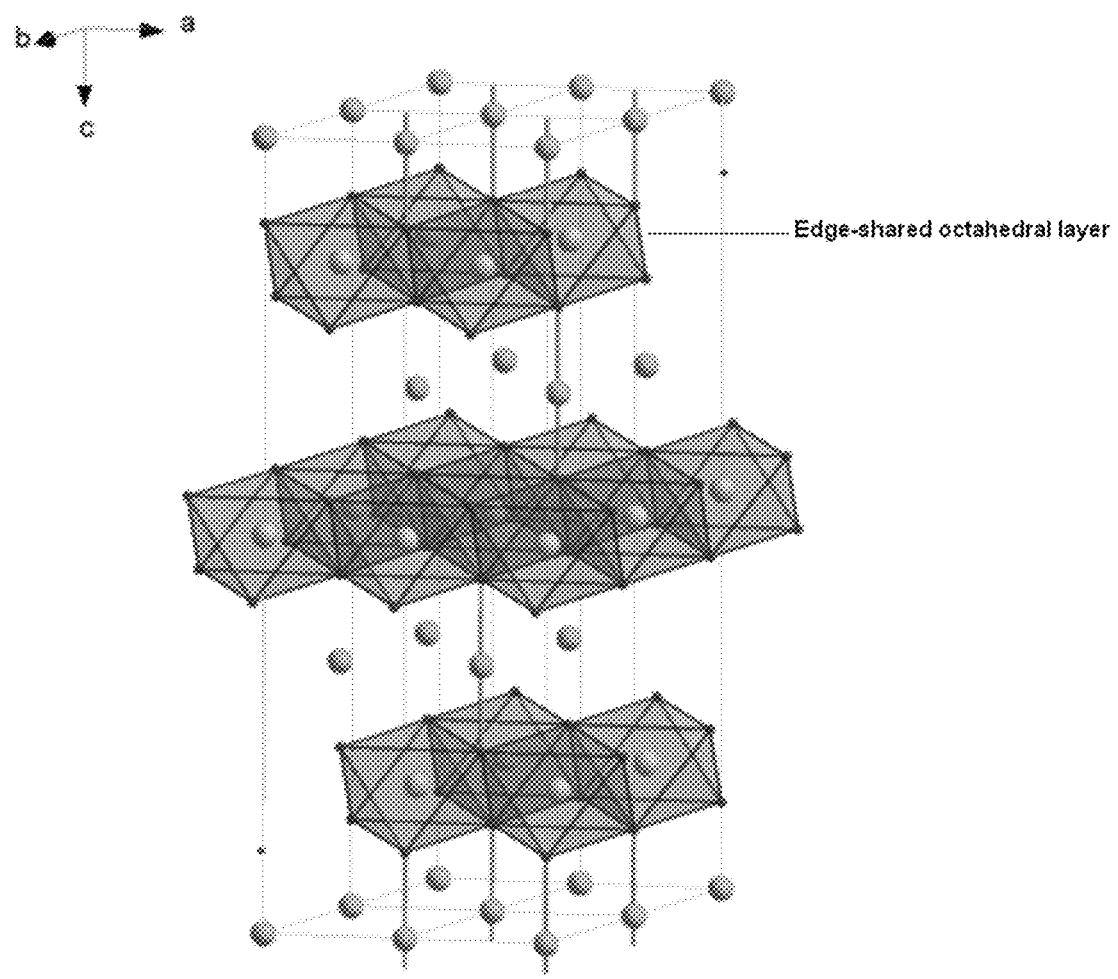
FIG. 1 illustrates an exemplary three-dimensional structure of a non-conductive metal compound included in a composition for forming a conductive pattern according to one exemplary embodiment of the present invention.

Referring to FIG. 1, the non-conductive metal compound may have the three-dimensional structure which includes a plurality of first layer (edge-shared octahedral layer) including at least one metal of the first and the second metal element and having a structure in which octahedrons sharing edges are two-dimensionally connected to each other and a second layer including different metal from that of the first layer and arranged between the neighboring first layers, and the three-dimensional structure may be referred to as the $R\bar{3}m$ or $P6_3/mmc$ space group in crystal structure.

After the composition for forming a conductive pattern including the non-conductive metal compound particles is used to mold a polymeric resin product or a resin layer, and an electromagnetic wave such as laser, or the like, is irradiated, the metal nuclei including the first or the second metal element or the ion thereof may be formed from the non-conductive metal compound. The metal nuclei may be selectively exposed on the predetermined region to which the electromagnetic wave is irradiated to form the adhesion-activated surface on the surface of the polymeric resin substrate. Then, when performing electroless plating with a plating solution including conductive metal ions, and the like, using the metal nuclei, and the like, including the first, the second metal element or the ion thereof, as a seed, the conductive metal layer may be formed on the adhesion-activated surface including the metal nuclei. Through this process, the conductive metal layer, in other words, fine conductive pattern may be selectively formed only on the predetermined region of the polymeric resin substrate, to which the electromagnetic wave is irradiated.

In particular, one of factors in which the metal nuclei and the adhesion-activated surface may be formed and therefore, more excellent conductive pattern may be formed by electromagnetic irradiation is the specific three-dimensional structure of non-conductive metal compound included in the composition according to one exemplary embodiment, for example, the three-dimensional structure schematically shown in FIG. 1.

In the three-dimensional structure of non-conductive metal compound, at least one metal element of the first and second metals is included in the first layer, wherein the first layer (edge-shared octahedral layer) has a structure in which octahedrons sharing edges are two-dimensionally connected to each other. In addition, the three-dimensional structure of non-conductive metal compound includes the second layer arranged between the neighboring first layers, together with a plurality of the above-described first layers. The second layer includes a metal different from that of the first layer, for example, the remaining metal element of the first and second metals which is not included in the first layer, and the metals of the second layer connect vertices of the octahedrons to each other between the neighboring first layers, thereby connecting two-dimensional structures thereof to each other.

In more specific exemplary embodiment, the non-conductive metal compound having the layered three-dimensional structure may include X (oxygen, nitrogen, or sulfur) together with the first and the second metal elements to be a compound generally represented by $ABX_2$ (A and B are each independently a first and a second metal element, and X is oxygen, nitrogen, or sulfur). In the compound having the general formula, at least one metal of the first and the second metal elements and X atoms may form the octahedrons sharing edges, and the octahedrons may be arranged in the two-dimensionally connected structure, thereby forming the first layer. In addition, as described above, the remaining metal not included in the first layer may form the second layer between the neighboring first layers, and the metal forming the second layer may connect the two-dimensionally connected structure thereof to each other between the first layers.

Here, the first or the second metal element forming the second layer may be one or more metal elements selected from the group consisting of Cu, Ag and Ni, which may be released from the non-conductive metal compound by electromagnetic irradiation. Further, the first or the second metal element forming the first layer may be one or more metal elements selected from the group consisting of Cr, Mo, Mn, Fe, Sn and W, which are different from the metal element forming the second layer.

Before electromagnetic irradiation, the non-conductive metal compound having the particular layered three-dimensional structure as described above exhibits non-conductivity and has excellent compatibility with the polymer resin, and also is chemically stable in the solution used in reduction or plating treatment so as to maintain non-conductivity. Therefore, the particles of the the non-conductive metal compound are uniformly blended with the polymeric resin substrate and maintains chemically stable state to exhibit non-conductivity in the region to which electromagnetic wave is not irradiated.

In contrast, the first, second metal element, or the ion thereof, and the like, may be easily generated from the non-conductive metal compound in the predetermined region to which electromagnetic wave such as laser, or the like, is irradiated. Here, it is expected that easy release of the metal or ion thereof from the non-conductive metal compound is attributed to the layered three-dimensional structure in which the first layer and the second layer are sequentially arranged in the non-conductive metal compound as described above. Since the non-conductive metal compound having the layered three-dimensional structure has lower vacancy formation energy of the second layer as compared to a compound having a non-layered three-dimensional structure, the first or second metal element or the ion thereof included in the second layer may be more easily released. As such, the metal or the ion thereof is more easily released from the non-conductive metal compound by electromagnetic irradiation, which is one of factors causing formation of the metal nuclei and the adhesion-activated surface.

However, the experimental results of the present inventors confirmed that the formation of the metal nuclei and the adhesion-activated surface is not attributed only to the specific three-dimensional structure of the non-conductive metal compound. As a result of continuous experiments and study, the present inventors found that among the non-conductive metal compounds of the above specific three-dimensional structure, for example, a specific compound of $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, or the like, is selected and included, and therefore, the compound of one exemplary embodiment is capable of exhibiting higher absorption and sensitivity with respect to electromagnetic wave such as laser, or the like, at a specific wavelength. In addition, it was also found that when controlling the irradiation conditions of the electromagnetic wave such as laser, or the like, to be described below, the metal nuclei and adhesion-activated surface may be finally formed, and a more excellent fine conductive pattern may be formed by electromagnetic irradiation such as laser, subsequent reduction, plating treatment, and the like.

Unlike the exemplary embodiment, when even though the composition for forming a conductive pattern has the above-described layered three-dimensional structure, inappropriate non-conductive metal compound such as $CuNiO_2$, or the like, described in Comparative Example to be described below is used, or the irradiation conditions of the electromagnetic wave such as laser, or the like, are not controlled at an appropriate range, the metal nuclei may not be formed, or the adhesion-activated surface including the metal nuclei and having larger roughness may not be properly formed, and excellent conductive pattern having excellent adhesion strength with the polymer resin may not be formed.

Therefore, due to the above specific three-dimensional structure of the non-conductive metal compound, and properties thereof, and control of the above-described all conditions for forming the metal nuclei and accordingly, the adhesion-activated surface, the composition for forming the conductive pattern of one exemplary embodiment is capable of easily forming more excellent fine conductive pattern, as compared to other compositions including a compound having a different three-dimensional structure such as spinel, or other compositions without metal nuclei formation. In addition, due to the property, when using the composition for forming the conductive pattern according to one exemplary embodiment, excellent and fine conductive metal layer may be more easily formed while decreasing an amount of the used non-conductive meal compound, more specifically, an amount or a content of the used first or the used second metal element, as compared to cases using other compositions including the non-conductive metal compounds having the non-layered three-dimensional structure such as the spinel, and the like.

Meanwhile, the particles of the non-conductive metal compound having the above-described specific three-dimensional structure may have specific particle size range of approximately 0.1 to 20 μm, or approximately 0.3 to 10 μm, or approximately 0.5 to 3 μm. The experimental results of the present inventors confirmed that since the particles of the non-conductive metal compound has the specific particle size range, deterioration of mechanical-physical properties such as impact strength, and the like, of the polymer resin caused by addition of the non-conductive metal compound particles may be minimized. It is expected that this confirmation is caused by the following technical principle.

The material having the above-described $R\bar{3}m$ or $P6_3/mmc$ space group in crystal structure may have a plate shaped structure in which c axis is longer than a axis and an aspect ratio is high, depending on characteristic of a three-dimensional structure and a crystal structure thereof (see FIG. 1). Due to the crystal structure, when the particle size of the non-conductive metal compound particles having the $R\bar{3}m$ or $P6_3/mmc$ space group is increased, an increased degree of the particle size may be more largely reflected due to the above-described high aspect ratio, and the like. As a result, dispersibility in the polymer resin of the non-conductive metal compound particles may be more largely deteriorated, and brittleness may be significantly increased, such that mechanical-physical properties such as impact strength, and the like, of the polymer resin may be more largely deteriorated. However, when the particle size of the non-conductive metal compound particles is controlled to be approximately 20 μm or less as described above, the above problem is reduced, such that the deterioration of mechanical-physical properties of the polymer resin caused by the addition of the non-conductive metal compound particles may be reduced.

However, when the particle size of the non-conductive metal compound particles are extremely decreased, specific surface area may be largely increased to increase hygroscopicity, or the like, and therefore, side effects with polymer resin such as a polycarbonate resin, or the like, may occur. The side effects may induce the poor physical properties or the increased viscosity of the polymer resin. In addition, lots of dust may be generated, which causes inconvenience during the process. However, when the particle size range of the non-conductive metal compound particles is appropriately controlled, the above problem may be reduced, and the deterioration of physical properties of the polymer resin may be inhibited, thereby reducing inconvenience during the process.

In addition thereto, it was confirmed that the non-conductive metal compound particles having optimized particle size range in the specific three-dimensional structure as described above may be more sensitively reacted to the electromagnetic wave even under the irradiation conditions of the electromagnetic wave such as relatively low powered laser, or the like, such that the metal nuclei may be more effectively formed, and the adhesion-activated surface including the metal nuclei and having improved roughness may be well formed. As a result, fine conductive pattern exhibiting more excellent adhesion strength may be favorably formed on the metal nuclei and the adhesion-activated surface.

In addition, since the non-conductive metal compound particles may be more sensitively reacted to the electromagnetic wave due to the above-described particle size range, even though the content itself of the non-conductive metal compound particles added in the polymer resin is decreased, the conductive pattern may be more effectively formed. Due to the above description, generally dark color of the non-conductive metal compound particles is easily shielded by minimum addition of a pigment or a colorant, thereby easily providing polymeric resin products having desired colors.

In order to obtain particles of the non-conductive metal compound having the specific particle size range, precursors containing the first and second metal elements forming the particles are mixed with each other and fired at high temperature to thereby obtain the non-conductive metal compound, and then, the compound may be fractured by a milling process, and the like. After obtaining the particles of the non-conductive metal compound having desired particle size range by the fracture process, the obtained particles may be dried and used for the above-described composition for forming the conductive pattern. Meanwhile, since proceeding conditions and methods of the fracture process may comply with general fracture processes such as a milling process of general inorganic particles (metal oxide particles, and the like), and the like, and the non-conductive metal compound particles may be prepared by other general preparation process of other general metal oxide particles, additional description thereof will be omitted.

Meanwhile, the composition for forming the conductive pattern of one exemplary embodiment as described above may exhibit reflectivity of approximately 25% or less or approximately 10 to 25% with respect to a laser electromagnetic wave having a wavelength corresponding to the infrared region, for example, having a wavelength of approximately 1000 nm to 1200 nm, or approximately 1060 nm to 1070 nm, for example, approximately 1064 nm.

The relatively low reflectivity with respect to the laser electromagnetic wave may reflect high absorption and sensitivity with respect to the laser electromagnetic wave generally applied at the time of forming the metal nuclei and the sequential conductive pattern. Therefore, when using the composition for forming the conductive pattern according to one exemplary embodiment showing the above-described range of low reflectivity, the metal nuclei and the adhesion-activated surface including the metal nuclei and having larger roughness may be well formed, and as a result, it is possible to form more excellent conductive pattern.

In addition, the low reflectivity of the composition for forming the conductive pattern may be achieved by using the non-conductive metal compounds having the above-described specific three-dimensional structure, in particular, by using the specific compounds such as $CuCrO_2$, $NiCrO_2$, $AgCrO_2$, $CuMoO_2$, $NiMoO_2$, $AgMoO_2$, $NiMnO_2$, $AgMnO_2$, $NiFeO_2$, $AgFeO_2$, $CuWO_2$, $AgWO_2$, $NiWO_2$, $AgSnO_2$, $NiSnO_2$, $CuSnO_2$, and the like, and by combinations of the specific non-conductive metal compounds with appropriate polymer resins to be describes below, compositions thereof, and the like.

Meanwhile, in the composition for forming the conductive pattern as described above according to one exemplary embodiment, the laser electromagnetic wave having a wavelength corresponding to the infrared region, for example, having a wavelength of approximately 1000 nm to 1200 nm, or approximately 1060 nm to 1070 nm, or approximately 1064 nm is irradiated at an average power of approximately 5 to 20 W, or approximately 7 to 15 W, such that the metal nuclei may be formed in a portion to which the electromagnetic wave is irradiated. As the irradiation condition of the electromagnetic wave such as laser, or the like, is controlled by the above-described range, the metal nuclei, the adhesion-activated surface including the metal nuclei and large roughness, and the like may be significantly well formed in the portion to which the laser is irradiated, and therefore, it is possible to form more excellent conductive pattern. Meanwhile, the irradiation conditions of the electromagnetic wave which allows the metal nuclei, and the like, to be formed, may be differently controlled depending on specific kinds of non-conductive metal compounds and polymer resins to be actually used, or compositions thereof.

In the composition for forming the conductive pattern as described above according to one exemplary embodiment, any thermosetting resin or thermoplastic resin capable of forming various polymeric resin products or resin layers may be used without specific limitation, as the polymer resin. In particular, the non-conductive metal compound particles having the above-described specific three-dimensional structure and particle size may exhibit excellent compatibility with various polymer resins and uniform dispersibility, and may hardly deteriorate mechanical-physical properties such as impact strength, and the like, of the polymer resin. Therefore, the composition according to one exemplary embodiment may include various polymer resins and may be molded as various resin products or resin layers. Specific examples of the polymer resin may include an ABS resin, a polyalkylene terephthalate resin such as a polybutyleneterephthalate resin, a polyethyleneterephthalate resin, or the like, a polycarbonate resin, a polypropylene resin, a polyphthalamide resin, and the like, and may include various polymer resins in addition thereto. Among the specific examples, the ABS resin or the polycarbonate resin is preferably used as the polymer resin so as to more preferably guarantee the formation of the metal nuclei and excellent conductive pattern.

In addition, in the composition for forming the conductive pattern, the non-conductive metal compound may be included in an amount of approximately 0.5 to 7 wt % or approximately 1 to 6 wt %, with respect to the total composition, and the polymer resin may be included in the remaining amount. According to the above-described amount range, mechanical-physical properties, and the like, of the polymeric resin products or the resin layers formed from the composition may be excellently maintained, and the conductive pattern may be formed on a predetermined region by the electromagnetic wave irradiation. As previously described, the composition according to one exemplary embodiment may include the non-conductive metal compound particles having the specific three-dimensional structure and the particle size range, such that even though the non-conductive metal compound particles have lower content, the metal nuclei and the conductive pattern having excellent adhesion strength may be favorably formed by the electromagnetic wave. Therefore, by decreasing the content of the non-conductive metal compound particles, physical properties of the resin products or the resin layers may be more excellently maintained, and colors of the additives may be hidden, whereby polymeric resin products showing excellent colors may be easily provided.

Further, the composition for forming the conductive pattern may further include one or more additives selected from the group consisting of a heat stabilizer, a UV stabilizer, a flame retardant, a lubricant, an antioxidant, an inorganic filler, a colorant, an impact modifier, and a functional modifier, in addition to the above-described polymer resin and predetermined non-conductive metal compound. In addition to the above-described materials, all of various additives that are known to be usable in composition for molding resin products may be used without specific limitation.

Meanwhile, according to another exemplary embodiment of the present invention, there is provided a method for forming the conductive pattern on the polymeric resin substrate such as the resin product, the resin layer, or the like, by direct electromagnetic irradiation using the above-described composition for forming the conductive pattern. The method for forming the conductive pattern may include molding the composition for forming a conductive pattern as described above to a resin product or applying the composition to another product so as to form a resin layer; irradiating an electromagnetic wave to a predetermined region of the resin product or the resin layer so as to generate a metal nuclei including a first or a second metal element or an ion thereof from non-conductive metal compound particles; and chemically reducing or plating the region in which the metal nuclei is generated so as to form a conductive metal layer.

Figure 2:
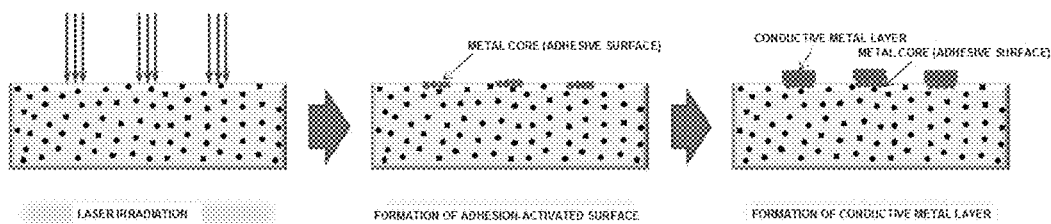
FIG. 2 illustrates a schematic diagram showing each step of an exemplary method for forming a conductive pattern according to another exemplary embodiment of the present invention.
Figure 3:
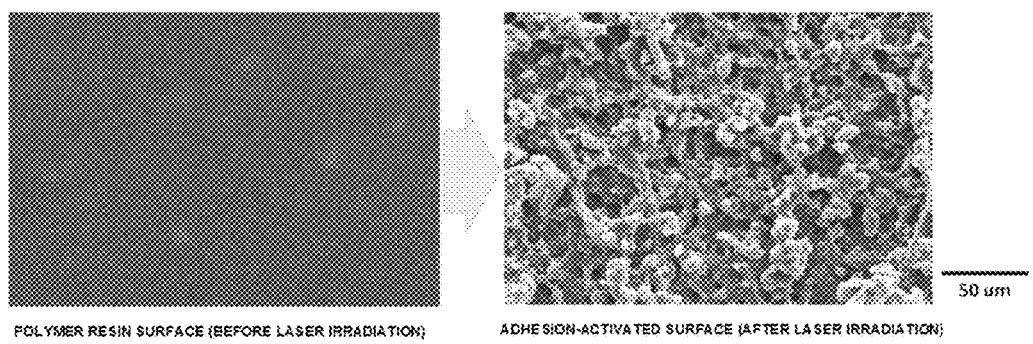
FIG. 3 is an electron microscopic image showing an adhesion-activated surface including a metal nuclei, which is formed on a surface of a polymeric resin substrate by electromagnetic irradiation in an exemplary method for forming a conductive pattern according to another exemplary embodiment of the present invention.

Hereinafter, each step of the method for forming the conductive pattern according to another exemplary embodiment will be described with reference to the accompanying drawings. For reference, FIG. 2 schematically illustrates one example of the method for forming the conductive pattern, which includes steps of irradiating an electromagnetic wave to the predetermined region of the resin product or the resin layer (the polymeric resin substrate) (that is, forming the metal nuclei and the adhesion-activated surface including the metal nuclei; first and second drawings), and forming the conductive metal layer. In addition, FIG. 3 is an electron microscopic image showing the metal nuclei and the adhesion-activated surface including the metal nuclei that are formed on the surface of the predetermined region of the polymeric resin substrate by electromagnetic irradiation in one example of the method for forming the conductive pattern.

In the method for forming the conductive pattern, first, the above-described composition for forming the conductive pattern may be molded to the resin product or applied to another product so as to form the resin layer. In the molding of the resin product or the forming of the resin layer, general methods for molding products using polymer resin compositions or general methods for forming resin layers may be applied without specific limitation. For example, in the molding of the resin product using the composition, the composition for forming the conductive pattern is extruded and cooled to form pellets or particles, which are subjected to injection molding to have a desired shape, thereby manufacturing various polymeric resin products.

The polymeric resin product or the resin layer thus formed may have the above-described non-conductive metal compound particles of the specific three-dimensional structure and particle size range as described above which are uniformly dispersed on the resin substrate formed from the polymer resin In particular, since the non-conductive metal compound has excellent compatibility with various polymer resins, sufficient solubility, and chemical stability, it may be uniformly dispersed throughout the resin substrate and maintain non-conductivity.

After forming the polymeric resin product or the resin layer, as illustrated in the first drawing of FIG. 2, an electromagnetic wave such as laser, or the like, may be irradiated to the predetermined region of the resin product or the resin layer, on which the conductive pattern is intended to be formed. When the electromagnetic wave is irradiated, the first or second metal element or the ion thereof may be released from the non-conductive metal compound, and the metal nuclei including the first or the second metal element or the ion thereof may be generated, and the adhesion-activated surface including the metal nuclei may be formed (see, a second drawing of FIG. 2).

More specifically, when the step of generating metal nuclei by electromagnetic irradiation is carried out, a part of the non-conductive metal compound particles is exposed on the surface of the predetermined region of the resin product or the resin layer, and the metal nuclei is generated therefrom, and thus the adhesion-activated surface which is activated to have higher adhesion strength may be formed (see FIG. 3). The adhesion-activated surface may include the metal nuclei while having large roughness. As the adhesion-activated surface is selectively formed only on the specific region to which the electromagnetic wave is irradiated, and after a plating step, and the like, to be described below, the conductive metal ions are chemically reduced by chemical reduction of the first or second metal ions included in the metal nuclei and the adhesion-activated surface, and/or by electroless plating thereof, such that the conductive metal layer may be more favorably formed on the predetermined region of the polymeric resin substrate. More specifically, upon electroless plating, the metal nuclei function as a kind of seed to form a strong bonding with the conductive metal ions included in the plating solution, when the conductive metal ions are chemically reduced. As a result, the conductive metal layer may be selectively formed in an easier manner.

In particular, as the non-conductive metal compound particles has the specific particle size range, the particles may be more sensitively reacted even under the irradiation of the electromagnetic wave such as relatively low powered laser, or the like, such that the adhesion-activated surface having larger roughness and the metal nuclei may be effectively formed, and the conductive metal layer (conductive pattern) having improved adhesion strength may be formed on the resin products or the resin layers from the adhesion-activated surface and the metal nuclei.

Meanwhile, in the step of generating the metal nuclei as described above, the laser electromagnetic wave may be irradiated, for example, the laser electromagnetic wave having a wavelength corresponding to the infrared region, for example, having a wavelength of approximately 1000 nm to 1200 nm, or approximately 1060 nm to 1070 nm, or approximately 1064 nm may be irradiated at an average power of approximately 5 to 20 W, or approximately 7 to 15 W.

By the irradiation of the laser electromagnetic wave, the formation of the metal nuclei from the non-conductive metal compound may be more preferably guaranteed, and the adhesion-activated surface including the metal nuclei may be selectively generated and exposed on the predetermined region.

Meanwhile, after the above-described step of generating the metal nuclei, the step of forming the conductive metal layer by chemically reducing or plating the region in which the metal nuclei and the adhesion-activated surface are formed may be carried out, as illustrated in a third drawing of FIG. 2. As a result of the reducing or the plating step, the conductive metal layer may be selectively formed on the predetermined region in which the metal nuclei and the adhesion-activated surface are exposed, and on the other region, the chemically stable non-conductive metal compound may maintain non-conductivity as it is. Therefore, the fine conductive pattern may be selectively formed only on the predetermined region of the polymeric resin substrate.

More specifically, the step of forming the conductive metal layer may proceed by electroless plating, and therefore, excellent conductive metal layer may be formed on the adhesion-activated surface.

In one example, in the reducing or the plating step, the predetermined region of the resin product or the resin layer in which the metal nuclei is generated may be treated with an acidic or basic solution including a reducing agent, and the solution may include one or more selected from the group consisting of formaldehyde, hypophosphite, dimethylamino borane (DMAB), diethylamino borane (DEAB) and hydrazine as the reducing agent. In addition, in the reducing or the plating step, the conductive metal layer may be formed by the electrode plating including treatment with an electroless plating solution including the above-described reducing agent and the conductive metal ions, and the like.

As the reducing or the plating step is carried out, the first or the second metal ions included in the metal nuclei are reduced, or the conductive metal ions included in the electroless plating solution are chemically reduced in the region where the metal nuclei is formed as a seed, and therefore, an excellent conductive pattern may be selectively formed on the predetermined region. Here, the metal nuclei and the adhesion-activated surface may form a strong bonding with the chemically reduced conductive metal ions, and as a result, the conductive pattern may be more easily formed selectively on the predetermined region.

Meanwhile, according to still another embodiment, there is provided a resin structure having the conductive pattern which is obtained by using the composition for forming the conductive pattern and the method for forming the conductive pattern as described above. The resin structure may include a polymeric resin substrate; non-conductive metal compound particles including a first metal element and a second metal element, having a R$\bar{3}$m or P6$_3$/mmc space group in crystal structure, having a particle size of 0.1 to 20 μm, and dispersed in the polymeric resin substrate; an adhesion-activated surface including a metal nuclei including a first or a second metal element or an ion thereof exposed on a surface of a predetermined region of the polymeric resin substrate; and a conductive metal layer formed on the adhesion-activated surface.

In the resin structure, the predetermined region in which the adhesion-activated surface and the conductive metal layer are formed may correspond to the region of the polymeric resin substrate to which the electromagnetic wave is irradiated. In addition, the first or second metal element or the ion thereof included in the metal nuclei of the adhesion-activated surface may be derived from the non-conductive metal compound particles. Meanwhile, the conductive metal layer may be derived from the first or second metal element or from the conductive metal ions included in the electroless plating solution.

Meanwhile, in the resin structure, the conductive metal layer is formed by using the non-conductive metal compound particles having the specific particle size range, such that the conductive metal layer may be formed on the polymeric resin substrate with improved adhesion strength. For example, the conductive metal layer may be formed on the polymeric resin substrate by adhesion at which a delamination area of a target metal layer under test is 0% (ISO class 0), or more than 0% to 5% or less (ISO class 1), of an area of the metal layer under the test according to standard ISO 2409.

Further, the resin structure may have impact strength of approximately 4.0 J/cm or more, measured by ASTM D256 despite the addition of the non-conductive metal compound.

Therefore, by using the resin structure, the polymeric resin product, and the like, having the conductive pattern formed on the polymeric resin substrate and maintaining excellent mechanical-physical properties may be provided.

In addition, the resin structure may further include residues which are dispersed in the polymeric resin substrate and derived from the non-conductive metal compound. These residues may have a structure in which vacancy resulting from the release of at least a part of the first or second metal from the three-dimensional structure of the non-conductive metal compound is at lease one portion of the compound.

The above described resin structure may become various resin products or resin layers such as a mobile phone case having the conductive pattern for antenna, or may become various resin products or resin layers having the conductive pattern, such as RFID tags, various sensors, MEMS structures, or the like.

EXAMPLES

Hereinafter, effects of the present invention will be described in more detail with reference to specific examples of the present invention. Meanwhile, these examples are illustrative only and the scope of the invention is not limited thereto.

Preparation Example 1

Synthesis of Non-Conductive Metal Compound CuCrO$_2$

Figure 4:
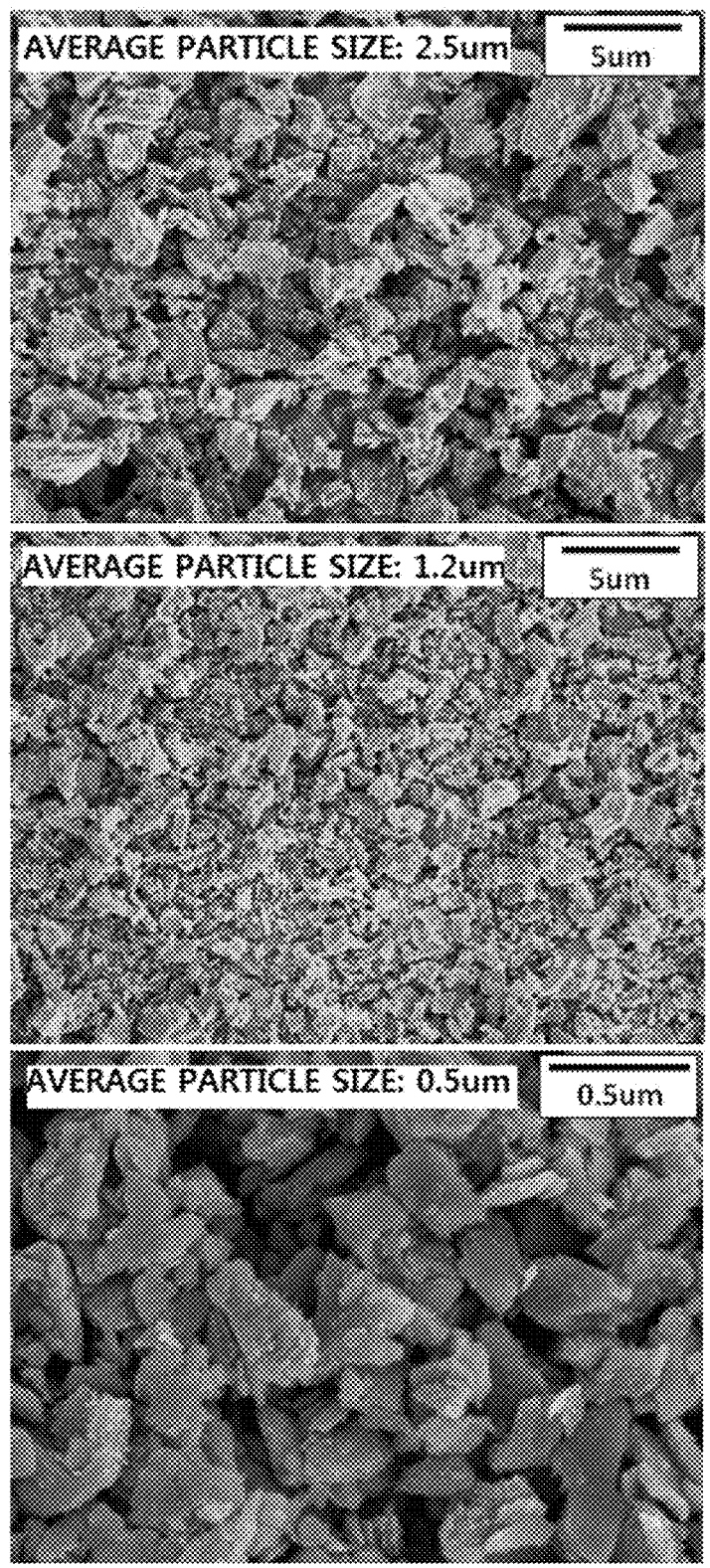
FIGS. 4 and 5 show an electron microscopic image and X-ray diffraction pattern of CuCrO$_2$ powder having a controlled particle size obtained in Preparation Example 1, respectively.
Figure 5:
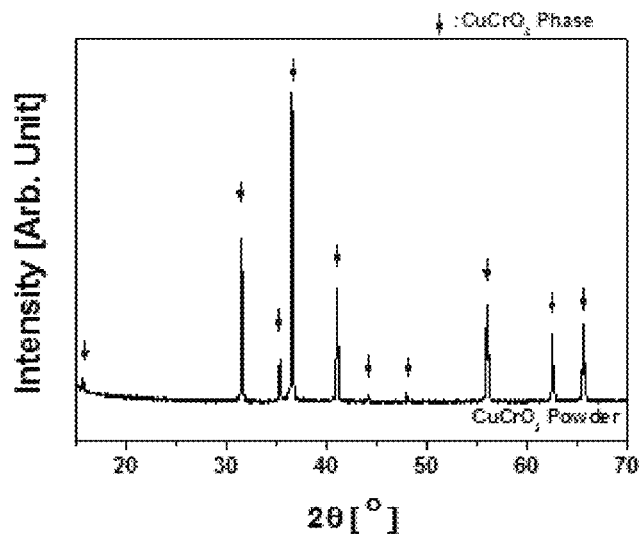

Raw materials, CuO and Cr$_2$O$_3$ were uniformly mixed with each other at a molar ratio of 2:1 by ball milling for 6 hours. Thereafter, the mixture was fired under conditions of atmospheric pressure and 1050° C. for 2 hours to synthesize a powder having Chemical Formula of CuCrO$_2$. After the synthesis, CuCrO$_2$ powders having controlled particle size to be used in the following Examples were prepared by controlling an additional pulverization treatment time. An electron microscopic image and an X-ray diffraction pattern of the CuCrO$_2$ powder are shown in FIGS. 4 and 5, respectively.

The electron microscope and X-ray diffraction analysis showed that the non-conductive metal compound has a plate shaped crystal structure, and the layered three-dimensional structure (a R$\bar{3}$m or P6$_3$/mmc space group in crystal structure) as illustrated in FIG. 1.

Example 1: Formation of Conductive Pattern by Direct Laser Irradiation

A composition for forming a conductive pattern by electromagnetic wave irradiation was prepared by using a polycarbonate resin as a base resin, non-conductive metal compound particles (CuCrO$_2$; particle size: 2.5 μm) obtained by Preparation Example 1 as an LDS additive, together with a thermal stabilizer (IR1076, PEP36), an UV stabilizer (UV329), a lubricant (EP184), an impact modifier (S2001), and the like, as additives for the process and stabilization.

5 wt % of the LDS additive and 5 wt % of other additives based on the polycarbonate resin were mixed with each other to obtain the composition, and extruded by an extruder at a temperature of 260 to 280° C. The extruded pellet-type resin structure was subjected to injection molding at approximately 260 to 270° C. to obtain a substrate having a diameter of 100 mm and a thickness of 2 mm as an izod bar type according to ASTM standard.

Figure 6:
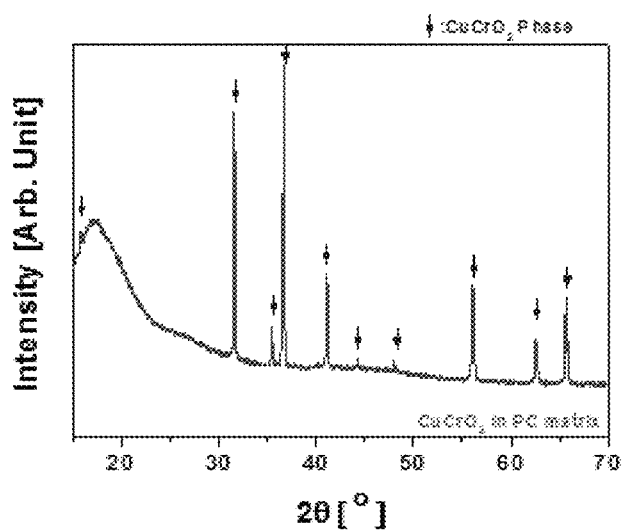
FIGS. 6 and 7 show a result of X-ray diffraction analysis and an electron microscopic image of a fracture surface of a resin substrate, after the resin substrate including CuCrO$_2$ particles was obtained in Example 1, respectively.
Figure 7:
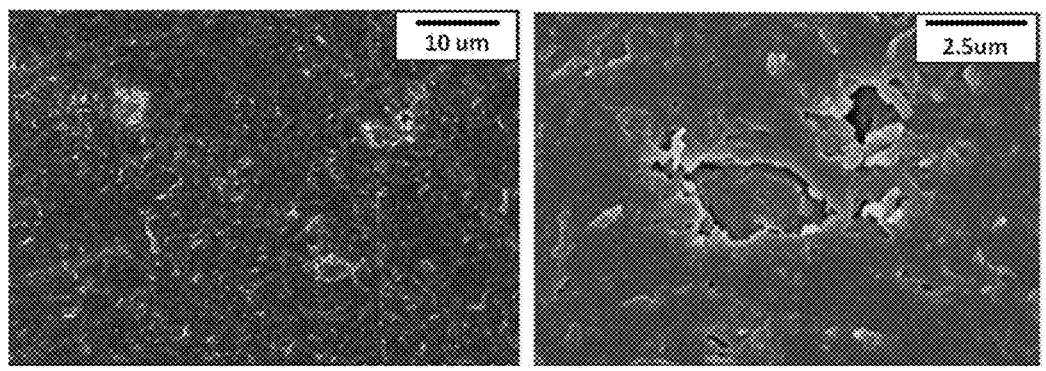

The resin substrate thus obtained was subjected to X-ray diffraction analysis (XRD) and the analysis results thereof are shown in FIG. 6. In addition, distribution of the non-conductive metal compound particles in the substrate was analyzed by electron microscope and the analysis results thereof are shown in FIG. 7. For reference, FIG. 7 is an electron microscopic image of the fracture surface of the substrate, and the right image of FIG. 7 is a partial enlarged view of the left image. Referring to FIGS. 6 and 7, it was confirmed that the non-conductive metal compound was favorably dispersed in the polycarbonate resin without degradation, before laser irradiation (FIG. 6), and these non-conductive metal compound particles were uniformly dispersed in the polycarbonate resin (FIG. 7).

In addition, izod notch impact strength of the injection molded resin structure was measured according to ASTM D256 standard as described in the following Experimental Example 2.

Figure 8:
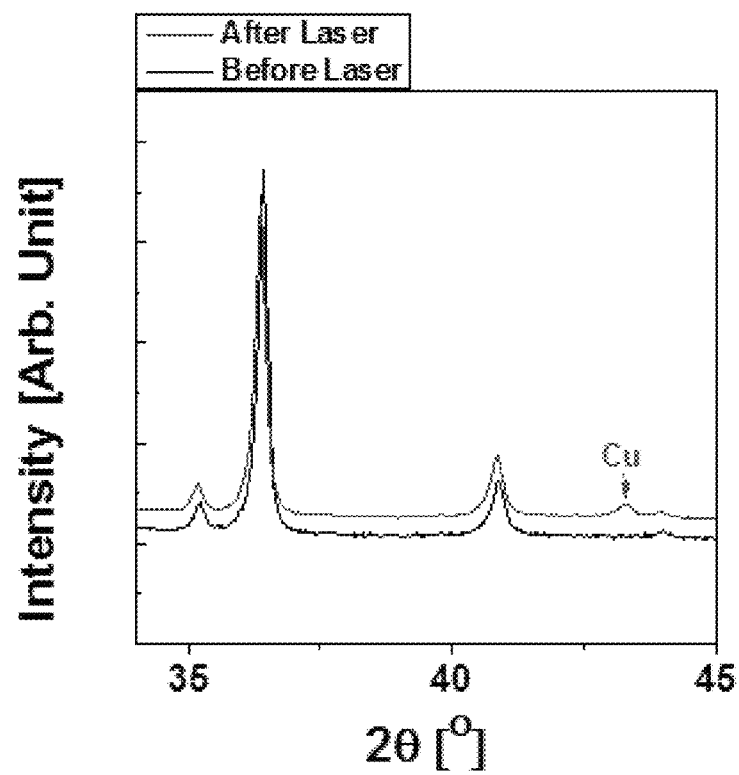
FIGS. 8 and 9 show the result of X-ray diffraction analysis and an electron microscopic image to examine whether the metal nuclei and the adhesion-activated surface including the metal nuclei are formed on the surface of the polymeric resin substrate after laser irradiation in Example 1, respectively.
Figure 9:
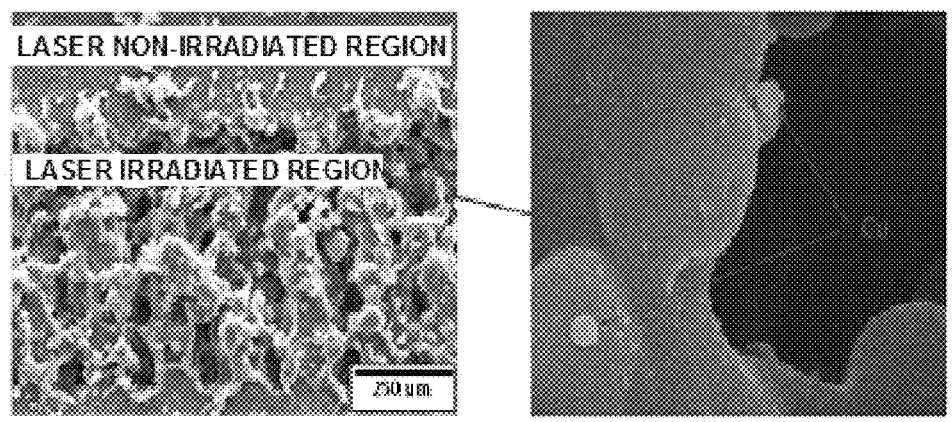

Meanwhile, the resin substrate as manufactured above was irradiated by laser having a wavelength of 1064 nm under the conditions of 40 kHz and 10 W using Nd-YAG laser so as to activate the surface. After laser irradiation, whether or not the copper-containing metal nuclei is formed in the polycarbonate resin was analyzed and confirmed by electron microscope and XRD and results thereof are shown in FIGS. 8 and 9, respectively. Referring to FIGS. 8 and 9, it was confirmed that after laser irradiation, a part of Cu or an ion thereof derived from the $CuCrO_2$ particles was reduced to form the metal seed (that is, the metal nuclei), and to form the adhesion-activated surface including the metal nuclei and large roughness.

Subsequently, the resin substrate of which surface was activated by laser irradiation was subjected to an electroless plating process as follows. The plating solution was prepared by dissolving 3 g of copper sulfate, 14 g of Rochelle salt, and 4 g of sodium hydroxide in 100 ml of deionized water. 1.6 ml of formaldehyde as a reducing agent was added to 40 ml of the plating solution thus prepared. The resin substrate of which surface was activated by laser was immersed in the plating solution for 4 to 5 hours, and then washed with distilled water. Adhesion performance of the conductive pattern (or plating layer) thus formed was evaluated according to the standard ISO 2409 like Experimental Example 1 to be described below.

Example 2: Formation of Conductive Pattern by Direct Laser Irradiation

A composition for forming a conductive pattern was prepared in the same manner as in Example 1, except that 3 wt % of the non-conductive metal compound particles ($CuCrO_2$ particles) were used as the LDS additive, and a resin structure having the conductive pattern was manufactured from the composition.

Examples 3 and 4: Formation of Conductive Patterns by Laser Direct Irradiation Compositions for forming a conductive pattern were prepared in the same manner as in Examples 1 and 2, respectively, except that non-conductive metal compound particles ($CuCrO_2$ particles) having a particle size of 1.2 μm were used as the LDS additive, and resin structures having the conductive pattern were manufactured from the composition.

Examples 5 to 8: Formation of Conductive Patterns by Laser Direct Irradiation Compositions for forming a conductive pattern were prepared in the same manner as in Example 1, except that non-conductive metal compound particles ($CuCrO_2$ particles) having a particle size of 0.5 μm were used in an amount of 5 wt % (Example 5), 3 wt % (Example 6), 2 wt % (Example 7), and 1 wt % (Example 8), respectively, as the LDS additive, and resin structures having the conductive pattern were manufactured from the composition.

Example 9: Formation of Conductive Patterns by Laser Direct Irradiation

A composition for forming a conductive pattern was prepared in the same manner as in Example 1, except that non-conductive metal compound particles ($CuCrO_2$ particles) having a particle size of 5 μm were used as the LDS additive, and a resin structure having the conductive pattern was manufactured from the composition.

Comparative Example 1: Formation of Conductive Patterns by Laser Direct Irradiation A composition for forming a conductive pattern was prepared in the same manner as in Example 1, except that $CuNiO_2$ having a particle size of 0.5 μm instead of $CuCrO_2$ was used as the non-conductive metal compound, and laser irradiation was carried out at a power of 3 W instead of 10 W, and a resin structure having the conductive pattern was manufactured from the composition.

Figure 10:
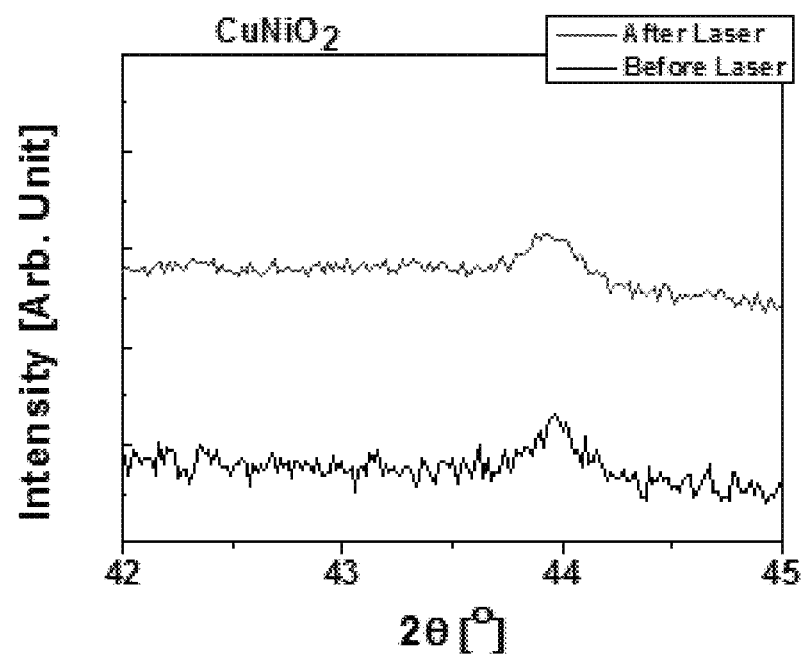
FIGS. 10 and 11 show a result of X-ray diffraction analysis to examine whether the metal nuclei is formed on the resin structure after laser irradiation in Comparative Example 1 and an electron microscopic image of the laser-irradiated surface, respectively.
Figure 11:
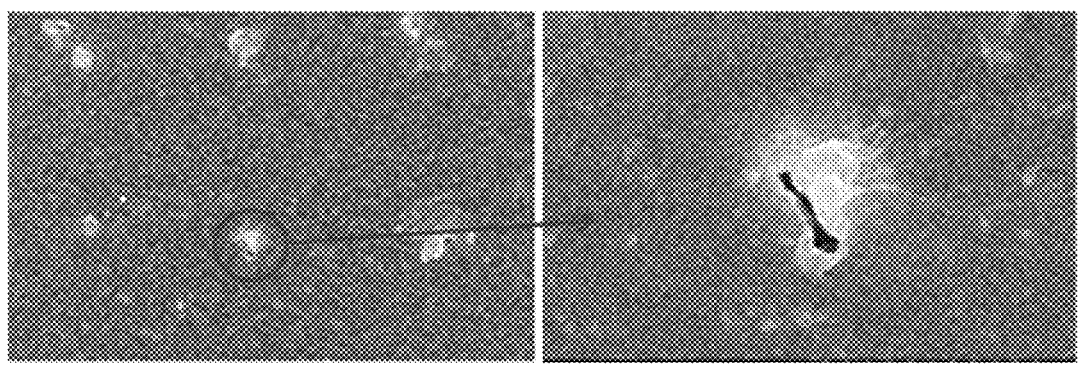

After laser irradiation, whether or not the copper-containing metal nuclei is formed in the polycarbonate resin was analyzed and confirmed by electron microscope and XRD and results thereof are shown in FIGS. 10 and 11, respectively. Referring to FIGS. 10 and 11, because of the inappropriate laser irradiation conditions, the non-conductive metal compound was hardly exposed to the laser even after laser irradiation, and sensitivity of the non-conductive metal compound to the laser was not sufficient, and thus no metal seed (that is, metal nuclei) derived from Cu, and the like was formed.

Experimental Example 1: Evaluation on Reflectivity of Resin Substrate to Laser and Evaluation on Adhesion of Conductive Pattern First, in Examples 5 to 7 and Comparative Example 1, reflectivity to the laser with a wavelength of 1064 nm in the resin substrate immediately before laser irradiation was measured using a UV-vis-NIR spectrometer. The measurement results are summarized in the following Table 1.

Referring to Table 1 below, it was found that the substrates of Examples 5 to 7 showed relatively low reflectivity to the laser, indicating high absorption and sensitivity to the laser, whereas the substrate of Comparative Example 1 showed high reflectivity, and low absorption and sensitivity to the laser. It was confirmed from above confirmation that formation of the metal nuclei and excellent conductive pattern is possible by using the compositions of Examples, compared to the composition of Comparative Example.

TABLE 1

|  | Example 5 | Example 6 | Example 7 | Comparative Example 1 (CuNiO$_2$) |
|---|---|---|---|---|
| Polycarbonate resin [wt %] | 90 | 92 | 93 | 90 |
| Non-conductive metal compound [wt %] | 5 | 3 | 2 | 5 |
| Impact modifier [wt %] | 4 | 4 | 4 | 4 |
| Other additive [wt %] | 1 | 1 | 1 | 1 |
| Particle size of non-conductive metal compound [μm] | 0.5 | 0.5 | 0.5 | 0.5 |
| Reflectivity to laser [%, at 1064 nm] | 19.3 | 20.1 | 21.1 | 30.5 |
| Laser irradiation power [W, at 1064 nm] | 10 | 10 | 10 | 3 |

Then, after the conductive pattern was formed in Examples 1 to 8 and Comparative Example 1, adhesion of each conductive pattern with respect to the polymeric resin substrate was evaluated as an evaluation on a delamination degree using a predetermined tape according to the standard ISO 2409.

As the evaluation result, evaluation on the delaminated area of the conductive pattern was conducted under the following ISO class standard.

1. Class 0: When the delaminated area of the conductive pattern is 0% of area of target conductive pattern under evaluation.
2. Class 1: When the delaminated area of the conductive pattern is more than 0% to 5% or less of area of target conductive pattern under evaluation.
3. Class 2: When the delaminated area of the conductive pattern is more than 5% to 15% or less of area of target conductive pattern under evaluation.
4. Class 3: When the delaminated area of the conductive pattern is more than 15% to 35% or less of area of target conductive pattern under evaluation.
5. Class 4: When the delaminated area of the conductive pattern is more than 35% to 65% or less of area of target conductive pattern under evaluation.
6. Class 5: When the delaminated area of the conductive pattern is more than 65% of area of target conductive pattern under evaluation.

As shown in Table 2 below, in Examples 1 to 8, the area of the delaminated conductive pattern of the entire area in which the conductive pattern is formed was significantly small, such that the adhesion was evaluated as class 0 or 1, and therefore, it was confirmed that the conductive pattern has excellent adhesion with respect to the polymeric resin substrate. Meanwhile, it was confirmed that conductive pattern with poor adhesion was formed in Comparative Example 1, which was easily removed.

TABLE 2

|  | Particle size of non-conductive metal compound [μm] | Particle Amount of non-conductive metal compound [wt %] | Laser average power [w] | ISO 2409 class |
|---|---|---|---|---|
| Example 1 | 2.5 | 5 | 10 | 0 |
| Example 2 |  | 3 | 10 | 1 |
| Example 3 | 1.2 | 5 | 10 | 0 |
| Example 4 |  | 3 | 10 | 1 |
| Example 5 | 0.5 | 5 | 10 | 0 |
| Example 6 |  | 3 | 10 | 0 |
| Example 7 |  | 2 | 10 | 0 |
| Example 8 |  | 1 | 10 | 0 |
| Comparative Example 1 (CuNiO$_2$) | 0.5 | 5 | 3 | 5 |

Figure 12:
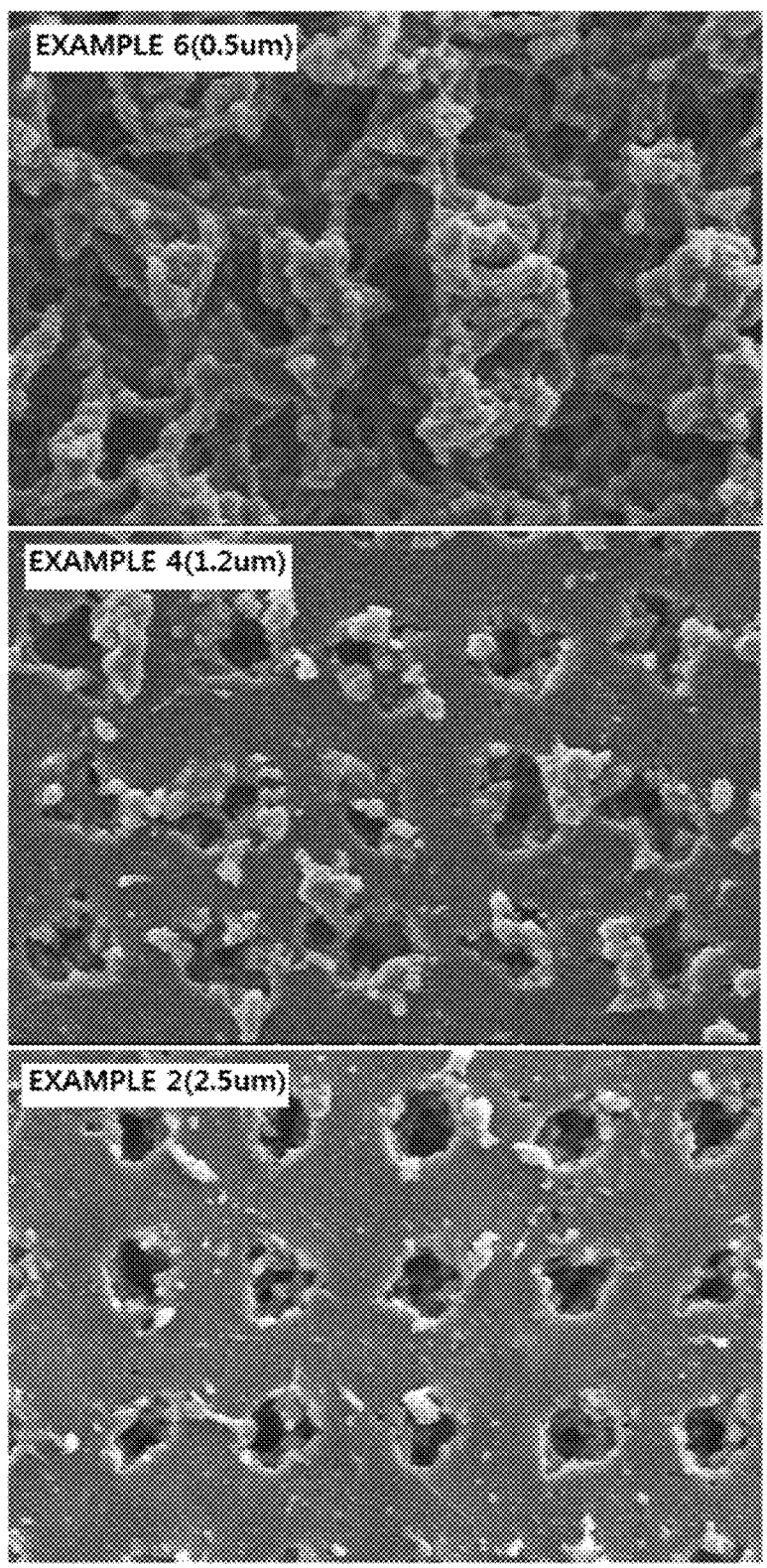
FIG. 12 shows electron microscopic images of the surface of the polymeric resin substrates in Examples 2, 4, and 6 after laser irradiation during a process of forming a conductive pattern.

Meanwhile, the surfaces of the polymeric resin substrate after the laser irradiation in the process for forming the conductive pattern according to Examples 2, 4, and 6 were observed by SEM, and observation results thereof were shown in FIG. 12.

Referring to FIG. 12, it was confirmed that when the non-conductive metal particles has a particles size of approximately 0.5 to 2.5 μm, as the particle size thereof becomes smaller, it is general that the particles are sensitively reacted to the laser irradiation, such that the adhesion-activated surface having large roughness is formed. It is considered that the conductive pattern exhibiting more excellent adhesion strength is capable of being formed due to the large roughness.

Experimental Example 2: Evaluation of Resin Structure on Mechanical Properties

Impact strength of the resin structures according to Examples 1, 3, 5, and 9 was measured by the standard ASTM D256, and compared with the polymer resin itself (polycarbonate resin) to which the non-conductive metal compound particles are not added, and results thereof are shown in Table 3 below.

TABLE 3

|  | Example 1 | Example 3 | Example 5 | Example 9 | PC |
|---|---|---|---|---|---|
| Polycarbonate resin [wt %] | 90 | 90 | 90 | 90 | 95 |
| Non-conductive metal compound [wt %] | 5 | 5 | 5 | 5 |  |
| Impact modifier [wt %] | 4 | 4 | 4 | 4 | 4 |
| Other additive [wt %] | 1 | 1 | 1 | 1 | 1 |
| Laser irradiation average power [W, at 1064 nm] | 10 | 10 | 10 | 10 | 10 |
| Izod notch impact strength [J/cm] | 5.4 | 6.4 | 4.7 | 6.9 | 6.8 |
| ISO 2409 class | 0 | 0 | 0 | 1 | 5 |

Referring to Table 3 above, it was confirmed in the resin structures of Examples that even though the non conductive metal compound particles are added to the resin structures and the conductive pattern is formed under the laser irradiation, excellent impact strength corresponding to that of general polymeric resin substrate is maintained.

The invention claimed is:
1. A composition for forming a conductive pattern by electromagnetic irradiation, comprising:
a polymer resin; and non-conductive metal compound particles including a first metal element and a second metal element, having a R3̄m or P6$_3$/mmc space group in crystal structure, and having a particle size of 0.1 to 20 μm, wherein a metal nuclei including the first metal, the second metal element or an ion thereof is formed from the non-conductive metal compound particles by electromagnetic irradiation.

2. The composition of claim 1, wherein the non-conductive metal compound particles include one or more compounds selected from the group consisting of CuCrO$_2$, NiCrO$_2$, AgCrO$_2$, CuMoO$_2$, NiMoO$_2$, AgMoO$_2$, NiMnO$_2$, AgMnO$_2$, NiFeO$_2$, AgFeO$_2$, CuWO$_2$, AgWO$_2$, NiWO$_2$, AgSnO$_2$, NiSnO$_2$ and CuSnO$_2$.

3. The composition of claim 1, wherein it exhibits reflectivity of 25% or less with respect to a laser electromagnetic wave having a wavelength of 1000 nm to 1200 nm.

4. The composition of claim 1, wherein the metal nuclei is formed by irradiating a laser electromagnetic wave having a wavelength of 1000 nm to 1200 nm at an average power of 5 to 20 W.

5. The composition of claim 1, wherein the polymer resin includes a thermosetting resin or a thermoplastic resin.

6. The composition of claim 5, wherein the polymer resin includes one or more selected from the group consisting of an ABS resin, a polyalkylene terephthalate resin, a polycarbonate resin, a polypropylene resin, and a polyphthalamide resin.

7. The composition of claim 1, wherein the non-conductive metal compound particles are included in an amount of 0.5 to 7 wt %, with respect to the total composition.

8. The composition of claim 1, further comprising one or more additives selected from the group consisting of a heat stabilizer, a UV stabilizer, a flame retardant, a lubricant, an antioxidant, an inorganic filler, a colorant, an impact modifier, and a functional modifier.

9. A method for forming a conductive pattern by direct electromagnetic irradiation comprising:

molding the composition for forming a conductive pattern of claim 1 to a resin product or applying the composition to another product so as to form a resin layer;

irradiating an electromagnetic wave to a predetermined region of the resin product or the resin layer so as to generate a metal nuclei including a first, a second metal or an ion thereof from non-conductive metal compound particles; and chemically reducing or plating the region in which the metal nuclei is generated so as to form a conductive metal layer.

10. The method of claim 9, wherein in the generating of the metal nuclei, a laser electromagnetic wave having a wavelength of 1000 nm to 1200 nm is irradiated at an average power of 5 to 20 W.

11. The method of claim 9, wherein in the generating of the metal nuclei, a part of the non-conductive metal compound particles is exposed on a surface of the predetermined region of the resin product or the resin layer to generate the metal nuclei therefrom, and an adhesion-activated surface activated so as to have higher adhesion is formed.

12. The method of claim 11, wherein the conductive metal layer is formed on the adhesion-activated surface by electroless plating.

13. A resin structure having a conductive pattern, comprising a polymeric resin substrate;

non-conductive metal compound particles including a first metal element and a second metal element, having a R3̄m or P6$_3$/mmc space group in crystal structure, having a particle size of 0.1 to 20 μm, and dispersed in the polymeric resin substrate;

an adhesion-activated surface including a metal nuclei including a first or a second metal or an ion thereof exposed on a surface of a predetermined region of the polymeric resin substrate; and a conductive metal layer formed on the adhesion-activated surface.

14. The resin structure of claim 13, wherein the predetermined region on which the adhesion-activated surface and the conductive metal layer are formed corresponds to a region of the polymeric resin substrate to which an electromagnetic wave is irradiated.

15. The resin structure of claim 13, wherein the conductive metal layer is formed on the polymeric resin substrate by adhesion at which a delamination area of a target metal layer under test is 0% (ISO Class 0), or more than 0% to 5% or less (ISO Class 1), of an area of the metal layer under the test according to standard ISO 2409.

16. The resin structure of claim 13, wherein an impact strength measured by ASTM D256 is approximately 4.0 J/cm or more.

* * * * *